(12) United States Patent
Toba et al.

(10) Patent No.: US 11,979,990 B2
(45) Date of Patent: *May 7, 2024

(54) WIRING BOARD AND METHOD FOR MANUFACTURING THE SAME

(71) Applicant: Showa Denko Materials Co., Ltd., Tokyo (JP)

(72) Inventors: Masaya Toba, Tokyo (JP); Kazuhiko Kurafuchi, Tokyo (JP); Takashi Masuko, Tokyo (JP); Kazuyuki Mitsukura, Tokyo (JP); Shinichiro Abe, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 373 days.

This patent is subject to a terminal disclaimer.

(21) Appl. No.: 17/415,030

(22) PCT Filed: Dec. 19, 2019

(86) PCT No.: PCT/JP2019/049933
§ 371 (c)(1),
(2) Date: Jun. 17, 2021

(87) PCT Pub. No.: WO2020/130100
PCT Pub. Date: Jun. 25, 2020

(65) Prior Publication Data
US 2022/0071018 A1    Mar. 3, 2022

(30) Foreign Application Priority Data
Dec. 20, 2018  (JP) ................................ 2018-238340

(51) Int. Cl.
B32B 3/00      (2006.01)
C23C 18/16    (2006.01)
(Continued)

(52) U.S. Cl.
CPC ......... H05K 3/181 (2013.01); C23C 18/1605 (2013.01); C23C 18/165 (2013.01);
(Continued)

(58) Field of Classification Search
CPC ...... H05K 3/181; C23C 18/165; C23C 18/20; C23C 18/32; C23C 18/38
See application file for complete search history.

(56) References Cited

U.S. PATENT DOCUMENTS

| 4,482,596 A | 11/1984 | Gulla et al. |
| 2002/0035784 A1 | 3/2002 | Koyama et al. |
| 2011/0221071 A1 | 9/2011 | Motohashi et al. |

FOREIGN PATENT DOCUMENTS

| CN | 101472407 A | 7/2009 |
| JP | S57-501786 A | 10/1982 |

(Continued)

OTHER PUBLICATIONS

WO-2015178101-A1 (Year: 2015).*
(Continued)

Primary Examiner — Elizabeth E Mulvaney
(74) Attorney, Agent, or Firm — FITCH, EVEN, TABIN & FLANNERY, LLP

(57) ABSTRACT

A method for manufacturing a wiring board according to the present disclosure includes: in the following order, (a) a step of irradiating an insulating layer composed of a resin composition with active energy rays; (b) a step of adsorbing an electroless plating catalyst to the insulating layer; and (c) a step of forming a metal layer on a surface of the insulating layer by electroless plating, in which in the step (a), a modified region having a thickness of 20 nm or more in a depth direction from the surface of the insulating layer and voids communicating from the surface of the insulating layer is formed by irradiation of the active energy rays.

14 Claims, 5 Drawing Sheets

(51) Int. Cl.

| | | |
|---|---|---|
| *C23C 18/20* | (2006.01) | |
| *C23C 18/32* | (2006.01) | |
| *C23C 18/38* | (2006.01) | |
| *H05K 1/03* | (2006.01) | |
| *H05K 3/18* | (2006.01) | |

(52) U.S. Cl.
CPC .............. *C23C 18/20* (2013.01); *C23C 18/32* (2013.01); *C23C 18/38* (2013.01); *H05K 1/032* (2013.01); *H05K 2201/068* (2013.01)

(56) References Cited

FOREIGN PATENT DOCUMENTS

| | | |
|---|---|---|
| JP | S59-200489 A | 11/1984 |
| JP | 2002-057456 A | 2/2002 |
| JP | 2003-318519 A | 11/2003 |
| JP | 2005-005319 A | 1/2005 |
| JP | 2011-042818 A | 3/2011 |
| JP | 2012-136769 A | 7/2012 |

OTHER PUBLICATIONS

Jinseong Kim et al., "Application of Through Mold via (TMV) as POP Base Package", Electronic Components and Technology Conference (ECTC), 2008, p. 1089-p. 1092 (cited in the specification).

Seung Wook YOON et al., "Advanced Low Profile POP Solution with Embedded Wafer Level POP (eWLB-PoP) Technology", Electronic Components and Technology Conference (ECTC), 2012, p1250-p1254 (cited in the specification).

\* cited by examiner (a)

(b)

(c)

(d)

(a)

(b)

(c)

(a)

(b)

WIRING BOARD AND METHOD FOR MANUFACTURING THE SAME

CROSS-REFERENCE TO RELATED APPLICATIONS

This application is a U.S. national phase application filed under 35 U.S.C. § 371 of International Application No. PCT/JP2019/049933, filed Dec. 19, 2019, designating the United States, which claims priority from Japanese patent application No. 2018-238340, filed Dec. 20, 2018, which are hereby incorporated herein by reference in their entirety.

Technical Field

The present disclosure relates to a wiring board and a method for manufacturing the same.

Background Art

There has been proposed an embodiment in which semiconductor elements (hereinafter, referred to as "chips" depending on circumstances) different in performance are mixedly mounted on one package for the purpose of higher density and higher performance of a semiconductor package. From the viewpoint of cost, a technology for high density interconnect between the chips becomes important (see Patent Literature 1).

A connection method called a package-on-package technology has been widely applied to a smartphone and a tablet terminal The package-on-package technology is a method for connecting different packages on a package by flip-chip mounting (see Non Patent Literatures 1 and 2). Further, there has been proposed, as a form of mounting chips at higher density, a packaging technology using an organic substrate having a high density wiring (organic interposer), a fan-out packaging technology (FO-WLP) having a through mold via (TMV), a packaging technology using a silicon interposer or a glass interposer, a packaging technology using a through-silicon via (TSV), a packaging technology using a chip embedded in a substrate for inter-chip transmission, or the like. Particularly, in the organic interposer and the FO-WLP, in a case where the semiconductor chips are mounted in parallel with each other, a micro wiring layer is required in order to make the semiconductor chips electrically conduct with each other at a high density (see Patent Literature 2).

Citation List

Patent Literature

Patent Literature 1: Japanese Unexamined Patent Publication No. 2003-318519

Patent Literature 2: US Patent Application Publication No. 2011/0221071

Non Patent Literature

Non Patent Literature 1: Application of Through Mold Via (TMV) as PoP Base Package, Electronic Components and Technology Conference (ECTC), 2008

Non Patent Literature 2: Advanced Low Profile PoP Solution with Embedded Wafer Level PoP (eWLB-PoP) Technology, ECTC, 2012

SUMMARY OF INVENTION

Technical Problem

In the technology described in Patent Literature 1, after the treatment with a desmear treatment solution, a seed layer is formed by electroless plating. The seed layer is a metal layer to be formed in the manufacturing process of the wiring board and is also called a power supply layer. That is, a conductive part is formed on the surface of the seed layer by supplying power to the seed layer. A part of the seed layer constitutes the metal wiring together with the conductive part. In the technology described in Patent Literature 1, the surface of the insulating layer is roughened by performing a wet desmear treatment. The surface of the insulating layer is properly roughened, and thereby the adhesiveness between the seed layer and the insulating layer is improved by an anchor effect.

Recently, a semiconductor element tends to be decreased in size, and a wiring board is also required to be micronized. When the surface of the insulating layer is roughened in order to obtain the anchor effect as decreased above, it is difficult to form a micronized wiring pattern (particularly, L/S (line/space) is 10/10 μm or less) on the surface thereof Recently, in the wiring board, a decrease in transmission loss in high-frequency bands is also required. As described above, when the surface of the insulating layer is roughened, the transmission loss is increased by a skin effect. That is, in the method for manufacturing a wiring board, it is an object to decrease a transmission loss in a high frequency while securing the adhesiveness between the insulating layer and the metal wiring.

The present disclosure has been devised in view of the above-described object, and provides a wiring board, which has excellent adhesiveness between an insulating layer and a metal wiring and a small transmission loss in a high frequency, and a method for manufacturing the same.

Solution to Problem

A method for manufacturing a wiring board according to an aspect of the present disclosure includes, in the following order:

(a) a step of irradiating an insulating layer composed of a resin composition with active energy rays;

(b) a step of adsorbing an electroless plating catalyst to the insulating layer; and (c) a step of forming a metal layer on a surface of the insulating layer by electroless plating, in which in the step (a), a modified region having a thickness of 20 nm or more in a depth direction from the surface of the insulating layer and voids communicating from the surface of the insulating layer is formed by irradiation of the active energy rays.

According to the studies of the present inventors, by adsorbing an electroless plating catalyst to an insulating layer in which the above-described modified region is formed by irradiation of active energy rays, the catalyst enters the voids of the modified region. When a metal layer is formed by electroless plating in this state, the electroless plating formed in the voids of the modified region acts like the root of the plant and is speculated to contribute to improvement in adhesiveness between the insulating layer and the metal layer. The irradiation with active energy rays in the step (a) is different from a roughening treatment with a desmear treatment solution and does not excessively roughen the surface of the insulating layer. That is, according to the above-described manufacturing method, even though the surface of the insulating layer is sufficiently flat (for example, the arithmetic average roughness Ra is 100 nm or less), sufficient adhesiveness between the insulating layer and the metal wiring can be secured. The surface of the insulating layer is sufficiently flat, and thereby a transmission loss in a high frequency can be sufficiently decreased.

In the step (a), for example, the modified region having the above-described configuration can be formed by irradiating the insulating layer with ultraviolet rays having a wavelength of 254 nm or less. In the step (c), the metal layer can be formed using an electroless copper plating solution or an electroless copper-nickel-phosphorus plating solution. From the viewpoint of realizing the adhesiveness between the insulating layer and the metal layer and a decrease in transmission loss in a high frequency at a much higher level, a nickel content rate of the metal layer is preferably 0.25 to 20% by mass. The metal layer containing a predetermined amount of nickel can be formed, for example, using an electroless copper-nickel-phosphorus plating solution or an electroless copper plating solution.

A wiring board according to another aspect of the present disclosure includes: an insulating layer composed of a resin composition; and a metal wiring provided on a surface of the insulating layer, in which the insulating layer has a modified region having a thickness of 20 nm or more in a depth direction from the surface, and copper contained in the metal wiring is dispersed in the modified region. As mentioned above, for example, in the case of forming a metal layer using an electroless copper-nickel-phosphorus plating solution or an electroless copper plating solution, copper is contained in the modified region of the insulating layer in a state of being dispersed. This state can be confirmed by elemental mapping.

In a case where a part of the metal wiring provided in the above-described wiring board is formed by electroless plating, an electroless plating catalyst (for example, palladium) is dispersed in the modified region. This can also be confirmed by elemental mapping.

When the average roughness Ra of the surface of the insulating layer is 100 nm or less, a decrease in transmission loss in a high frequency can be realized at a much higher level. The resin composition constituting the insulating layer may be a cured product of a thermosetting resin composition and may be a cured product of a photosensitive resin composition.

Advantageous Effects of Invention

According to the present disclosure, there are provided a wiring board, which has excellent adhesiveness between an insulating layer and a metal wiring and a small transmission loss in a high frequency, and a method for manufacturing the same.

DESCRIPTION OF EMBODIMENTS

Figure 1:
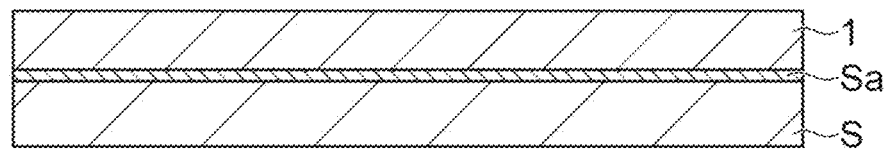
FIG. 1(a) to FIG. 1(d) are cross-sectional views schematically illustrating a manufacturing process of a wiring board according to an embodiment of the present disclosure.
Figure 1:
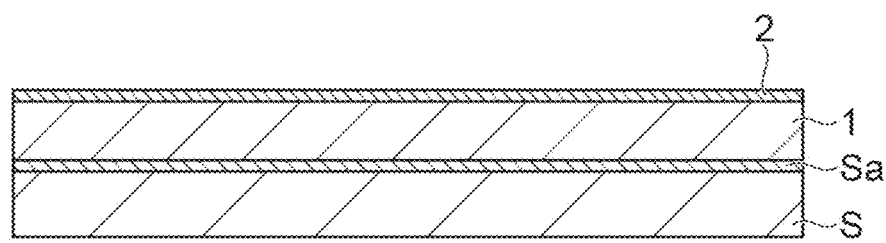
Figure 1:
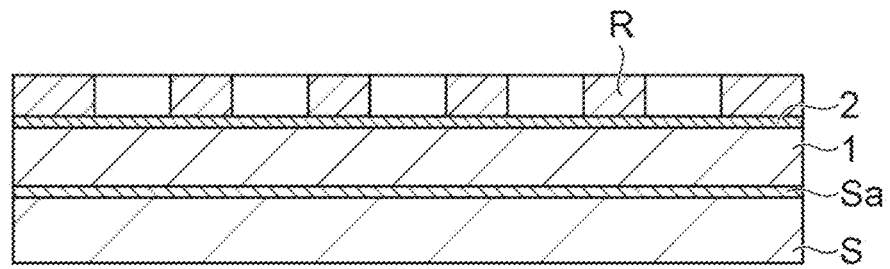
Figure 1:
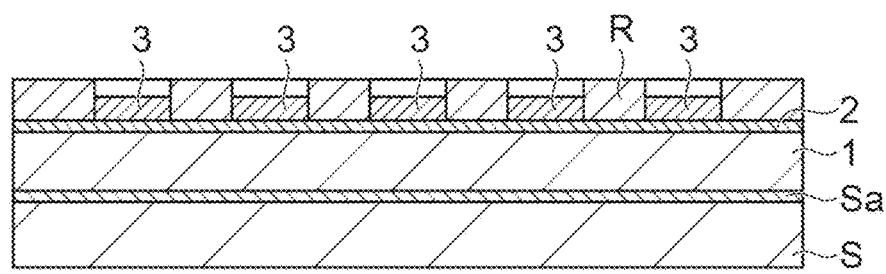

Hereinafter, embodiments of the present disclosure will be specifically described with reference to the drawings. In the following description, the same or similar portions are denoted with the same reference signs and repeated description is omitted. Furthermore, unless otherwise specified, positional relationships such as top, bottom, right, and left are assumed to be based on positional relationships illustrated in the drawings. Further, dimension ratios in the drawings are not limited to illustrated ratios.

In a case where terms "left", "right", "front side", "rear side", "over", "under", "upward", "downward", and the like are used in the description of the present specification and the claims, these are intended to provide explanation, and do not necessarily mean a permanent relative positional relationship. Furthermore, the term "layer" encompasses a structure of a shape thereof formed all over a surface seen as a plan view and also a structure of a shape thereof partially formed.

Figure 2:
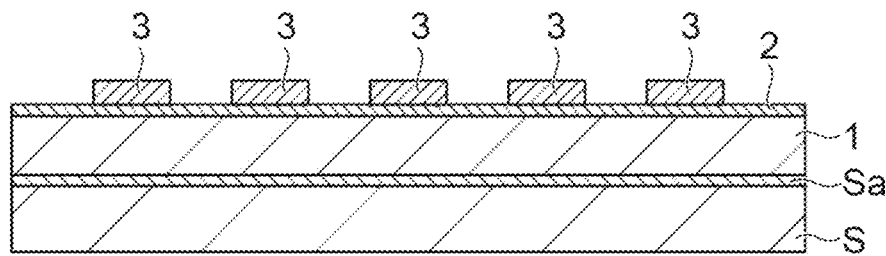
FIG. 2(a) to FIG. 2(c) are cross-sectional views schematically illustrating the manufacturing process of the wiring board according to the embodiment of the present disclosure.
Figure 2:
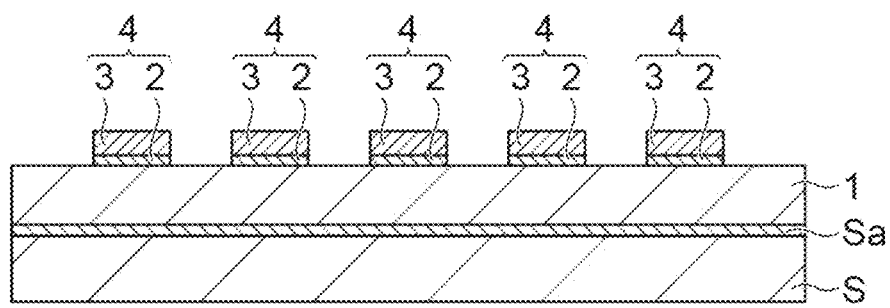
Figure 2:
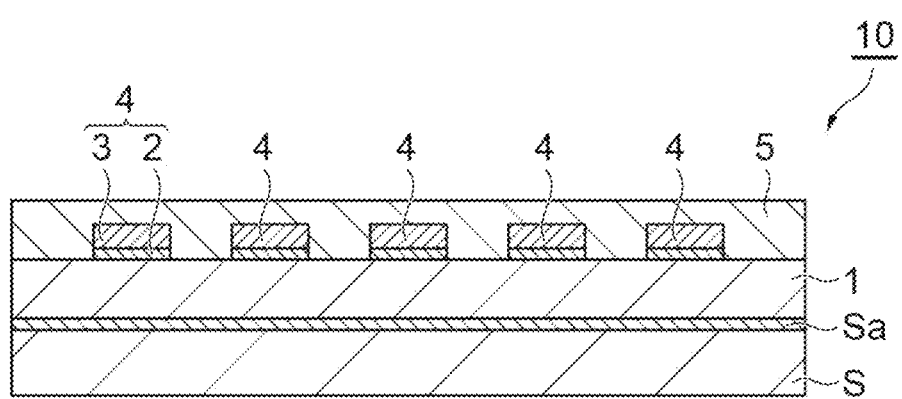

FIG. 1(a) to FIG. 1(d) and FIG. 2(a) to FIG. 2(c) are cross-sectional views schematically illustrating a manufacturing process of a wiring board. A wiring board 10 schematically illustrated in FIG. 2(c) is particularly suitable for an embodiment in which micronization and higher pin count are required, and is suitable particularly for an embodiment of packaging in which an interposer is required for mixedly mounting different kinds of chips. More specifically, the manufacturing method according to the present embodiment is suitable for an embodiment of packaging in which the spacing of pins is 200 μm or less (more specifically, for example, 30 to 100 μm) and the number of pins is 500 or more (more specifically, for example, 1000 to 10000).

When the nickel content rate of a region (a seed layer 2) that is in contact with a first insulating layer 1 in a metal wiring 4 is 0.25 to 20% by mass, the metal wiring 4 has excellent adhesiveness with respect to the first insulating layer 1 without surface roughening of the first insulating layer 1 by a desmear treatment solution. Therefore, a micro wiring can be formed on the surface of the first insulating layer 1, and a transmission loss in a high frequency can be sufficiently decreased.

The wiring board 10 is manufactured through the following steps, as roughly classified:

(1) a step of forming the first insulating layer 1 on a support substrate S;
(2) a step of irradiating a surface of the first insulating layer 1 with active energy rays;
(3) a step of forming the seed layer 2 (metal layer) on the surface of the first insulating layer 1;
(4) a step of forming a wiring part 3 (conductive part) on the seed layer 2; and
(5) a step of forming a second insulating layer 5 to cover the metal wiring 4.

<(1) Step of forming first insulating layer on support substrate>

The first insulating layer 1 is formed on the support substrate S (FIG. 1(a)). The support substrate S is not particularly limited, and examples thereof include a silicon plate, a glass plate, an SUS (stainless steel) plate, a glass cloth-containing substrate, a semiconductor element-containing sealing resin, and a high stiffness substrate is preferred. The support substrate S illustrated in FIG. 1(a) has a conductive layer Sa formed on a surface on which the first insulating layer 1 is formed. As the support substrate S, a support substrate having no conductive layer Sa formed or a support substrate having a wiring and/or a pad on a surface instead of the conductive layer Sa may be used.

The thickness of the support substrate S is preferably in a range of 0.2 mm to 2.0 mm. When the thickness thereof is less than 0.2 mm, handling of the support substrate S becomes difficult; on the other hand, when the thickness thereof is more than 2.0 mm, a material cost of the support substrate S tends to increase. The support substrate S may be wafer-shaped or panel-shaped. The size thereof is not particularly limited, and a wafer having a diameter of 200 mm, 300 mm, or 450 mm or a rectangular panel having a side of 300 to 700 mm is preferably used.

A material constituting the first insulating layer 1 may be a photosensitive resin material and may be a thermosetting resin material. As these insulating materials, a liquid or film-shaped insulating material is exemplified, and from the viewpoint of film thickness flatness and the cost, a film-shaped insulating material is preferred. Furthermore, from the viewpoint that a micronized wiring can be formed, the insulating material preferably contains a filler having an average particle diameter of 500 nm or less (more preferably 50 to 200 nm). The content of the filler of the insulating material is preferably 0 to 70 parts by mass and more preferably 10 to 50 parts by mass with respect to 100 parts by mass of the insulating material excluding the filler.

In the case of using a film-shaped insulating material, a lamination step thereof is preferably performed at a temperature as low as possible, and an insulative film capable of being laminated at 40° C. to 120° C. is preferably adopted. In the case of an insulative film having a temperature enabling lamination of lower than 40° C., there are tendencies that tackiness is strong at normal temperature (about 25° C.) and handling property deteriorates, and in the case of a photosensitive insulative film having a temperature enabling lamination of higher than 120° C., there is a tendency that warpage becomes large after lamination.

The thermal expansion coefficient of the first insulating layer 1 after curing is preferably $80 \times 10^{-6}$ /K (kelvin) or less from the viewpoint of suppressing warpage, and is more preferably $70 \times 10^{-6}$ /K or less from the viewpoint of obtaining high reliability. Furthermore, from the viewpoint of obtaining a stress relaxation property of the insulating material and a high-definition pattern, the thermal expansion coefficient is preferably $20 \times 10^{-6}$ /K or more. The thickness of the first insulating layer 1 is preferably 10 μm or less, more preferably 5 μm or less, and further preferably 3 μm or less. Furthermore, from the viewpoint of insulation reliability, the thickness of the first insulating layer 1 is preferably 0.5 μm or more.

For example, an opening (not illustrated) reaching the conductive layer Sa may be provided in the first insulating layer 1 according to the use application or embodiments of the wiring board 10. In the case of forming the first insulating layer 1 by a photosensitive resin composition, the opening may be provided, for example, by photolithography. In the case of forming the first insulating layer 1 by a thermosetting resin composition, the opening may be provided, for example, by laser processing.

From the viewpoint of decreasing a transmission loss in a high frequency, the surface of the first insulating layer 1 is preferably as flat as possible. That is, the arithmetic average roughness Ra of the surface of the first insulating layer 1 is 100 nm or less, preferably 80 nm or less, and more preferably 55 nm or less. The lower limit value of the arithmetic average roughness Ra of the surface of the first insulating layer 1 is, for example, 5 nm and may be 10 nm or 20 nm. The arithmetic average roughness Ra can be measured using a laser microscope. The following procedure may be adopted for obtaining the arithmetic average roughness Ra of the surface of the first insulating layer 1 from the cross-section of the laminate including the first insulating layer 1. That is, a difference (Rz value) between the projection and the recess is measured from surfaces of a plurality of samples in which values of the arithmetic average roughness Ra are known. A standard curve is created on the basis of the measured Rz value and the known Ra value. The difference (Rz value) between the projection and the recess in the cross-section of the first insulating layer 1 in which the arithmetic average roughness Ra should be obtained is measured, and the arithmetic average roughness Ra can be obtained from this measurement value and the standard curve.

<(2) Step of irradiating surface of first insulating layer with active energy rays>

Figure 3:
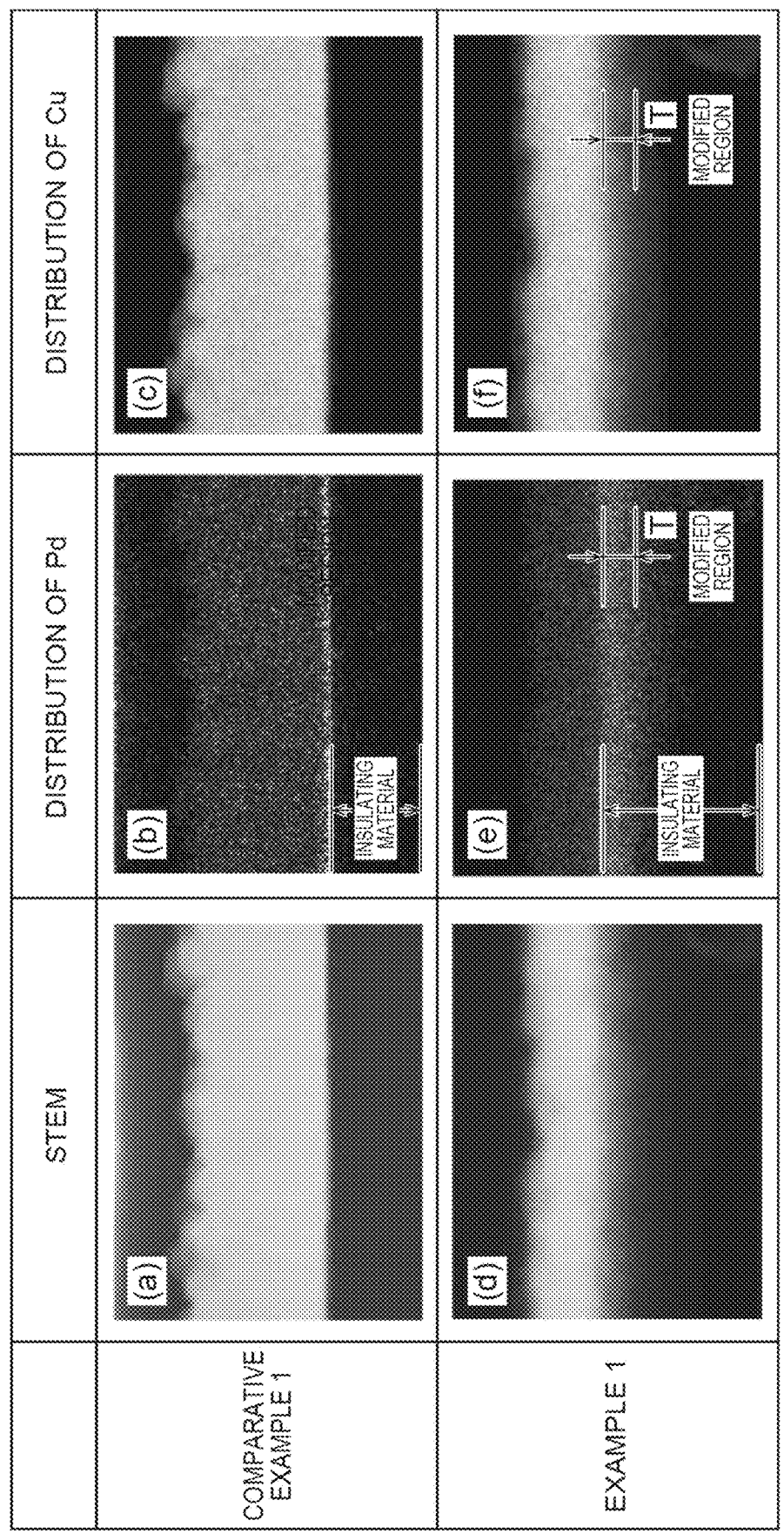
FIG. 3(a) to FIG. 3(f) are images showing cross-sections of a laminate according to Comparative Example 1 or Example 1.

Before the seed layer 2 is formed on the surface of the first insulating layer 1, the surface of the first insulating layer 1 is irradiated with active energy rays to form a modified region on the surface of the first insulating layer 1 (see FIG. 3(d) to FIG. 3(f)). The modified region has a thickness of 20 nm or more in a depth direction from the surface of the first insulating layer 1. The modified region has voids communicating from the surface of the first insulating layer 1.

By adsorbing an electroless plating catalyst to the first insulating layer 1 in which the modified region is formed, the catalyst enters the voids of the modified region (see FIG. 3(e)). When the seed layer 2 is formed by electroless plating in this state, the electroless plating formed in the voids of the modified region acts like the root of the plant and is speculated to contribute to improvement in adhesiveness between the first insulating layer 1 and the seed layer 2. Any active energy rays may be used as long as they do not excessively roughen the surface of the first insulating layer 1, and examples thereof include ultraviolet rays, electron beams, α rays, β rays, and γ rays. By adjusting the amount of irradiation of active energy rays and the intensity thereof, a modified region having a thickness of 20 nm or more can be formed, and the arithmetic average roughness Ra of the surface of the first insulating layer 1 can be maintained to 100 nm or less.

From the viewpoint of improving the adhesiveness between the first insulating layer 1 and the seed layer 2, the thickness of the modified region is 20 nm or more and may be 25 nm or more or 30 nm or more. The upper limit value of the thickness of the modified region is, for example, 200 nm and may be 180 nm or 150 nm. It is necessary to irradiate the modified region with an excessive amount of active energy rays in order to excessively increase the thickness of the modified region, and as a result, the surface of the first insulating layer 1 is roughened so that the arithmetic average roughness Ra may exceed 100 nm. Note that, since the surface of the first insulating layer 1 is preferably as flat as possible, it is preferable that a roughening treatment with a desmear treatment solution is not performed with respect to the surface of the first insulating layer 1 before the seed layer 2 is formed.

<(3) Step of forming seed layer on surface of first insulating layer>

The seed layer 2 is formed on the surface of the first insulating layer 1 by electroless plating containing at least copper (FIG. 1(b)). The seed layer 2 is formed through the following steps. First, the surface of the first insulating layer 1 is cleaned with a pretreatment liquid. The pretreatment liquid may be a commercially available alkaline pretreatment liquid containing sodium hydroxide or potassium hydroxide. The pretreatment is performed at concentration of sodium hydroxide or potassium hydroxide of 1 to 30% by mass. The pretreatment is performed for an immersion time in the pretreatment liquid of 1 to 60 minutes. The pretreatment is performed at an immersion temperature in the pretreatment liquid of 25° C. to 80° C. After the pretreatment, in order to remove the redundant pretreatment liquid, cleaning may be performed with city water, pure water, ultrapure water, or an organic solvent.

After the removal of the pretreatment liquid, in order to remove alkali ions from the surface of the first insulating layer 1, immersion cleaning is performed with an acidic aqueous solution. The acidic aqueous solution may be a sulfuric acid aqueous solution, and immersion cleaning is performed at a concentration of 1 to 20% by mass for an immersion time of 1 to 60 minutes. In order to remove the acidic aqueous solution, cleaning may be performed with city water, pure water, ultrapure water, or an organic solvent.

Subsequently, palladium that becomes an electroless plating catalyst is attached to the surface of the first insulating layer 1 after the immersion cleaning The palladium may be a commercially available palladium-tin colloidal solution, an aqueous solution containing palladium ions, a palladium ion suspension liquid, or the like, and is preferably an aqueous solution containing palladium ions effectively adsorbed to a modified layer. At the time of immersion in an aqueous solution containing palladium ions, immersion is performed at a temperature of the aqueous solution containing palladium ions of 25° C. to 80° C. and an immersion time for adsorption of 1 to 60 minutes. After palladium ions are adsorbed, in order to remove the palladium ions, cleaning may be performed with city water, pure water, ultrapure water, or an organic solvent.

After adsorption of the palladium ions, activation for causing the palladium ions to act as a catalyst is performed. A reagent causing the palladium ions to activate may be a commercially available activating agent (activation treatment liquid). The activation is performed at a temperature of the activating agent to be used in immersion for activating the palladium ions of 25° C. to 80° C. and an immersion time for activation of 1 to 60 minutes. After the activation of the palladium ions, in order to remove the redundant activating agent, cleaning may be performed with city water, pure water, ultrapure water, or an organic solvent.

Subsequently, the seed layer 2 is formed by electroless plating of the surface of the first insulating layer 1. The seed layer 2 becomes a power supply layer for electrolytic plating to be performed in the step (3). The thickness of the seed layer 2 is preferably 20 to 200 nm, more preferably 40 to 200 nm, and further preferably 60 to 200 nm.

The nickel content rate of the seed layer 2 is 0.25 to 20% by mass, and may be, for example, 3 to 20% by mass or 0.25 to 3% by mass. The nickel content rate of the seed layer 2 can be set, for example, by adjusting the nickel content rate of the electroless plating solution. When the nickel content rate of the seed layer 2 is 0.25% by mass or more, the adhesiveness between the first insulating layer 1 and the seed layer 2 can be sufficiently secured; on the other hand, when the nickel content rate is 20% by mass or less, a transmission loss in a high frequency can be sufficiently decreased.

Examples of the electroless plating include electroless pure copper plating (purity of copper: 99% by mass or more) and electroless copper-nickel-phosphorus plating (nickel content rate: 1 to 10% by mass, phosphorus content: 1 to 13% by mass). The electroless copper-nickel-phosphorus plating solution may be a commercially available plating solution. As commercially available products of such a plating solution, for example, an electroless copper-nickel-phosphorus plating solution (manufactured by JCU CORPORATION, trade name "AISL-570") can be mentioned. The electroless copper-nickel-phosphorus plating is performed in an electroless copper-nickel-phosphorus plating solution set at 60° C. to 90° C.

An electroless copper plating solution having a nickel content rate of 0.1 to 1% by mass may be used in the formation of the seed layer 2. Examples of commercially available products of such a plating solution include electroless copper plating solutions (trade names "Copper Solution Printoganth MV TP1", "Stabilizer Printoganth MV TP1", "Basic Printoganth MV TP1", "Moderator Printoganth MV TP1", and "Reducer Cu" manufactured by Atotech Japan K.K.). The electroless copper plating is performed in an electroless copper plating solution set at 20° C. to 50° C.

After the electroless plating, in order to remove the redundant plating solution, cleaning may be performed with city water, pure water, ultrapure water, or an organic solvent. Furthermore, after the electroless plating, in order to increase the sticking force between the seed layer 2 and the first insulating layer 1, thermal curing (annealing . age-curing treatment by heating) may be performed. The heating is preferably performed at a thermal curing temperature of 80° C. to 200° C. In order to further accelerate reactivity, the heating is performed more preferably at 120° C. to 200° C. and further preferably at 120° C. to 180° C. The thermal curing time is preferably 5 to 60 minutes, more preferably 10 to 60 minutes, and further preferably 20 to 60 minutes.

<(4) Step of forming wiring part on seed layer>

A wiring-forming resist R is patterned on the surface of the seed layer 2 (see FIG. 1(c)). A commercially available resist may be used as the wiring-forming resist R, and for example, a negative-tone film-shaped photosensitive resist (manufactured by Hitachi Chemical Co., Ltd., Photec RY-5107UT) can be used. The resist pattern may be provided with an opening for wiring formation and, as necessary, other openings. That is, a resist is formed using a roll laminator, a phototool having a pattern formed is then bonded thereto, exposure is performed using an exposure device, spray development is then performed by a sodium carbonate aqueous solution, and thereby a resist pattern can be formed. Note that, a positive-tone photosensitive resist may be used instead of a negative-tone photosensitive resist.

By supplying power to the seed layer 2, electrolytic copper plating is performed to form the wiring part 3 (see FIG. 1(d)). The thickness of the wiring part 3 is preferably 1 to 10 µm, more preferably 3 to 10 µm, and further preferably 5 to 10 µm.

After the electrolytic copper plating, the wiring-forming resist R is peeled off (see FIG. 2(a)). The peeling-off of the wiring-forming resist R may be performed using a commercially available peeling solution. The exposed seed layer 2 is removed by the peeling-off of the wiring-forming resist R (see FIG. 2(b)). Thereby, the metal wiring 4 configured by the seed layer 2 remaining on the surface of the first insulating layer 1 and the wiring part 3 is formed. Along with the removal of the seed layer 2, palladium remaining below the seed layer 2 may be removed. The removal thereof may be performed using a commercially available removal liquid (etching solution), and specifically, an acidic etching solution (manufactured by JCU CORPORATION, BB-20, PJ-10, SAC-700W3C) is exemplified.

<(5) Step of forming second insulating layer to cover metal wiring>

The second insulating layer 5 is formed to cover the metal wiring 4 (see FIG. 2(c)). The material constituting the second insulating layer 5 may be the same as or different from the material for the first insulating layer.

Hereinbefore, the wiring board and the method for manufacturing the same have been described, but the present invention is not necessarily limited to the aforementioned embodiments and may be adequately modified within a scope not departing from the gist thereof For example, in the above-described embodiments, the method for manufacturing a wiring board having one wiring layer (a layer including the metal wiring 4 and the second insulating layer 5) has been exemplified, but a wiring board having a plurality of wiring layers may be manufactured by repeating a step of providing the seed layer on the surface of the wiring layer and a series of steps (3) and (4) described above.

Examples

The present disclosure will be more specifically described by means of the following Examples; however, the present invention is not limited to these examples.

(Example 1)

<Production of photosensitive resin film>

A photosensitive resin film for an insulating layer was produced as follows. First, a photosensitive resin composition was prepared using the following components.

Photoreactive resin containing a carboxyl group and an ethylenically unsaturated group: Acid-modified cresol novolac type epoxy acrylate (CCR-1219H, manufactured by Nippon Kayaku Co., Ltd., trade name) 50 parts by mass Photopolymerization initiator component: 2,4,6-Trimethylbenzoyl-diphenyl-phosphine oxide (Darocur TPO, manufactured by BASF Japan Ltd., trade name) and ethanone, 1-[9-ethyl-6-(2-methylbenzoyl)-9H-carbazol-3-yl]-, 1-(o-acetyl oxime) (IRGACURE OXE-02, manufactured by BASF Japan Ltd., trade name) 5 parts by mass Thermal curing agent component: Biphenol type epoxy resin (YX-4000, manufactured by Mitsubishi Chemical Corporation, trade name) 10 parts by mass Inorganic filler component: average particle diameter: 50 nm, silane coupling treated with vinylsilane. The inorganic filler component was mixed to be 10 parts by volume with respect to 100 parts by volume of the resin component. Note that, the particle size distribution of the inorganic filler was measured using a dynamic light scattering-type Nanotrac particle size distribution analyzer "UPA-EX150" (manufactured by NIKKISO CO., LTD.) and a laser diffraction scattering-type Microtrac particle size distribution analyzer "MT-3100" (manufactured by NIKKISO CO., LTD.), and it was confirmed that the maximum particle diameter was 1 μm or less.

A solution of the above-described photosensitive resin composition was applied onto the surface of a polyethylene terephthalate film (manufactured by TEIJIN LIMITED, trade name: G2-16, thickness: 16 μm). The coating film was dried at 100° C. for about 10 minutes using a hot air convection type dryer. Thereby, a photosensitive resin film having a thickness of 10 μm was obtained.

<Formation of wiring layer having micro wiring>

As a support substrate, a glass cloth-containing substrate (size: 200 mm square, thickness: 1.5 mm) having a copper layer (thickness: 20 μm) formed on the surface was prepared.

Step (1a)

In order to form the first insulating layer on the surface of the copper layer of the above-described support substrate, the above-described photosensitive resin film was laminated. Specifically, first, the photosensitive resin film was placed on the surface of the copper layer of the support substrate. Next, this product was pressed using a press type vacuum laminator (MVLP-500, manufactured by MEIKI CO., LTD.). The press conditions were set to a hot pressing plate temperature of 80° C., a vacuuming time of 20 seconds, a laminate press time of 60 seconds, an atmospheric pressure of 4 kPa or less, and a crimping pressure of 0.4 MPa.

Step (1b)

By performing an exposure treatment and a development treatment to the pressed photosensitive resin film (first insulating layer), an opening reaching the copper layer of the support substrate was provided. The exposure was performed in a state where the phototool having a pattern formed is bonded onto the first insulating layer. The exposure was performed using an i-line stepper exposure machine (product name: S6CK type exposure machine, lens: ASC3(Ck), manufactured by CERMA PRECISION, INC.) at an energy dose of 30 mJ/cm$^2$. Next, spray development was performed by 1% by mass of a sodium carbonate aqueous solution set at 30° C. for 45 seconds to provide an opening. Next, the surface of the developed first insulating layer was subjected to post-UV exposure using a mask exposure machine (EXM-1201 type exposure machine, manufactured by ORC MANUFACTURING CO., LTD., main wavelength of ultraviolet rays: 365 nm) at an energy dose of 2000 mJ/cm$^2$. Next, the thermal curing was performed in a clean oven at 170° C. for 1 hour.

Step (2)

The first insulating layer was irradiated with ultraviolet rays using an ultraviolet irradiation device (SSP-16, manufactured by SEN LIGHTS Corporation, main wavelength of ultraviolet rays: 254 nm). The amount of irradiation of ultraviolet rays was set to 185 mJ/cm$^2$. Thereby, the surface of the first insulating layer was modified. The distance from an ultraviolet lamp to the surface of the first insulating layer was set to 40 mm, and the ultraviolet ray irradiation time was set to 30 seconds. The arithmetic average roughness Ra of the surface of the insulating layer after irradiation of ultraviolet rays was measured using a laser microscope (manufactured by Olympus Corporation). The results are shown in Table 1.

Step (3)

The seed layer was formed on the surface of the first insulating layer by electroless copper plating. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute.

Next, as electroless copper plating, the substrate was immersed in a mixed solution of electroless copper-nickel-phosphorus plating solutions (manufactured by JCU CORPORATION, trade name: AISL-570B, AISL-570C, and AISL-570MU) and PC-BA (AISL-570B concentration: 70 mL/L, AISL-570C concentration: 24 mL/L, AISL-570MU concentration: 50 mL/L, PC-BA concentration: 13 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. Thereby, a laminate including the support substrate, the insulating layer, and the seed layer (thickness: about 90 nm, nickel content rate: 6% by mass) in this order was obtained.

(Example 2)

A laminate was obtained in the same manner as in Example 1, except that the amount of irradiation of ultraviolet rays (main wavelength: 254 nm) in the step (2) was set to 46 mJ/cm$^2$ instead of 185 mJ/cm$^2$. The measurement value of the arithmetic average roughness Ra of the surface of the insulating layer after irradiation of ultraviolet rays is shown in Table 1.

(Example 3)

A laminate was obtained in the same manner as in Example 1, except that the amount of irradiation of ultraviolet rays (main wavelength: 254 nm) in the step (2) was set to 26 mJ/cm$^2$ instead of 185 mJ/cm$^2$. The measurement value of the arithmetic average roughness Ra of the surface of the insulating layer after irradiation of ultraviolet rays is shown in Table 1.

(Example 4)

A laminate was obtained in the same manner as in Example 1, except that the amount of irradiation of ultraviolet rays (main wavelength: 254 nm) in the step (2) was set to 4 mJ/cm$^2$ instead of 185 mJ/cm$^2$. The measurement value of the arithmetic average roughness Ra of the surface of the insulating layer after irradiation of ultraviolet rays is shown in Table 1.

(Comparative Example 1)

A laminate was obtained in the same manner as in Example 1, except that the step (2) was not performed, that is, the insulating layer was not irradiated with ultraviolet rays. The measurement value of the arithmetic average roughness Ra of the surface of the insulating layer without irradiation of ultraviolet rays is shown in Table 1.

From the results shown in Table 1, it can be found that the value of the arithmetic average roughness Ra of the insulating layer is not dependent on the amount of irradiation of ultraviolet rays; on the other hand, the 90° peeling strength is greatly dependent on the amount of irradiation of ultraviolet rays.

<Measurement of thickness of modified region>

Cross-sections of the laminates according to Examples 1 to 4 and Comparative Example 1 were enlarged and observed, and then the thickness of the modified region was measured. The following two types of apparatuses were used in this measurement.

Scanning transmission electron microscope (STEM): HD-2700 (manufactured by Hitachi High-Tech Corporation)

Energy dispersion type X-ray fluorescence spectrometer (EDX): Octane T Ultra W 100 mm$^2$ SDD (manufactured by Hitachi High-Tech Corporation)

Figure 4:
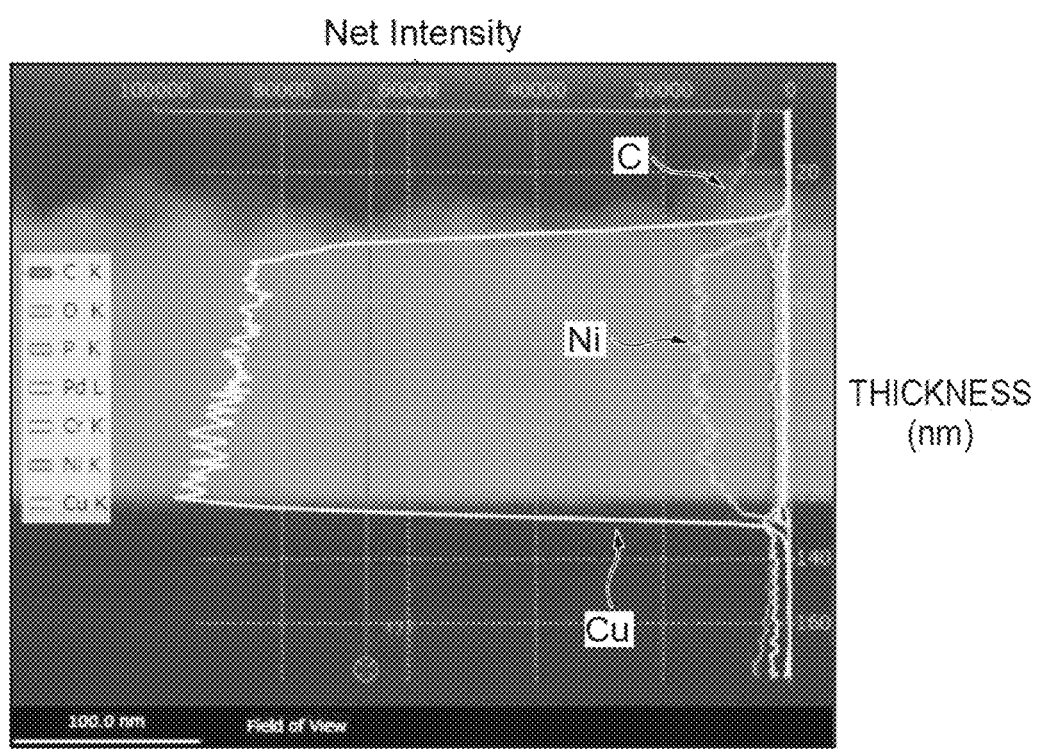
FIG. 4(a) is an image showing a cross-sectional EDX line analysis result according to Comparative Example 1 and FIG. 4(b) is an image showing a cross-sectional EDX line analysis result according to Example 1.
Figure 4:
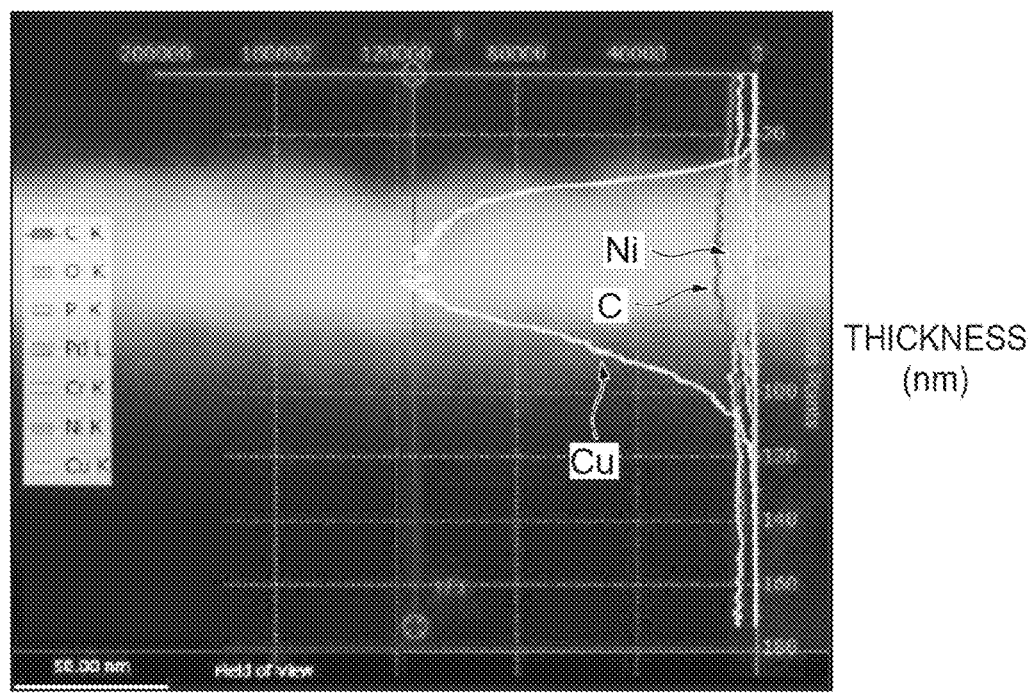

FIG. 3(a) to FIG. 3(f) are images showing cross-sections of a laminate according to Comparative Example 1 or Example 1. FIG. 3(b) and FIG. 3(e) are elemental mapping of palladium (electroless plating catalyst) obtained by EDX. FIG. 3(c) and FIG. 3(f) are elemental mapping of copper (electroless plating main component) obtained by EDX. Note that, FIG. 4(a) is an image showing a cross-sectional EDX line analysis result according to Comparative Example 1 and FIG. 4(b) is an image showing a cross-sectional EDX line analysis result according to Example 1.

From these images, the thickness of the modified region was visually specified. The thickness of the modified region in Example 1 (the thickness T shown in FIG. 3(e) and FIG. 3(f)) was 45 nm. It was confirmed that the thickness of the modified region in Examples 2 to 4 is 20 nm or more. Note that, the modification by irradiation of ultraviolet rays is not performed in Comparative Example 1, and thus the modified region does not exist.

<Evaluation of adhesiveness between insulating layer and seed layer>

The adhesiveness between the insulating layer and the seed layer in the laminates according to Examples 1 to 4 and Comparative Example 1 was evaluated by measuring the 90° peeling strength. A bench peel tester EZ-SX (manufactured by SHIMADZU CORPORATION) was used. The measurement was performed under the following conditions. The results are shown in Table 1.

Test piece width: 10 mm

Peeling rate: 10 mm/min

TABLE 1

| | Amount of irradiation of ultraviolet rays (mJ/cm$^2$) | Ra of surface of insulating layer (nm) | 90° peeling strength (kN/m) |
|---|---|---|---|
| Example 1 | 185 | 45 | 0.48 |
| Example 2 | 46 | 50 | 0.65 |
| Example 3 | 26 | 44 | 0.78 |
| Example 4 | 4 | 45 | 0.39 |
| Comparative Example 1 | — | 47 | 0.02 |

<Formation of microstrip wiring>

(Example 5)

Figure 5:
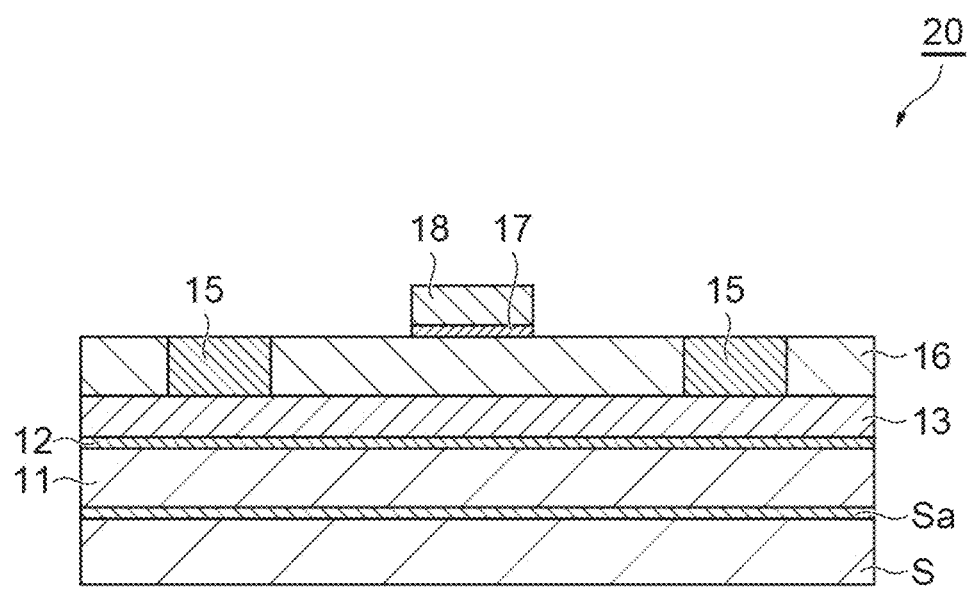
FIG. 5 is a cross-sectional view schematically illustrating a wiring board provided with a microstrip wiring produced for evaluating a transmission loss in a high frequency in Examples and Comparative Examples.

A wiring board having the same configuration as that of a wiring board 20 illustrated in FIG. 5 was manufactured for evaluating a transmission loss in a high frequency. The wiring board 20 is a wiring board having a microstrip wiring. That is, the wiring board 20 is configured by a support substrate S having a conductive layer Sa (copper layer) on the surface, an insulating layer 11 provided on the surface of the support substrate S, a seed layer 12 provided on the surface of the insulating layer 11, a ground layer 13 (conductor part) provided on the surface of the seed layer 12, a conductor part 15 and an insulating layer 16 provided on the surface of the ground layer 13, and a seed layer 17 and a signal layer 18 (conductor part) provided on the surface of the insulating layer 16. The seed layer 12 is used as a power supply layer when the ground layer 13 is formed. The seed layer 17 is used as a power supply layer when the signal layer 18 is formed. Upon manufacturing the wiring board, the insulating layer 11 was formed using the same photosensitive resin film as that of Example 1. The signal layer 18 was formed to have a thickness of 4 μm, a width of 20 μm, and a length of 10 mm. A wiring board according to Example 5 was manufactured through the steps of forming the seed layers 12 and 17, respectively, by the same method as in Example 1.

(Comparative Example 2)

A wiring board according to Comparative Example 2 was manufactured in the same manner as in Example 5, except that the seed layers 12 and 17 were formed respectively by the following method. That is, the seed layers 12 and 17 were formed in the same manner as in Example 1, except that, in the step (1c), the surface of the insulating layer was modified (roughened) using a chemical liquid used in the desmear treatment instead of irradiation of ultraviolet rays. The treatment by a chemical liquid used in the desmear treatment was performed as follows. First, for a swelling treatment, the substrate was immersed in 40 mL/L of a sweller (manufactured by Atotech, trade name: Cleaner Securiganth 902) at 70° C. for 5 minutes. Thereafter, the substrate was immersed in pure water for 1 minute. Next, for a roughening treatment, the substrate was immersed in 40 mL/L of a desmear solution (manufactured by Atotech, trade name: Compact CP) at 70° C. for 10 minutes. Thereafter, the substrate was immersed in pure water for 1 minute. Thereafter, the substrate was immersed in pure water at 25° C. for 5 minutes and then dried by a hot plate set at 80° C. for 5 minutes. The arithmetic average roughness Ra of the surface of the insulating layer according to Comparative Example 2 was 411 nm.

<Measurement of transmission loss>

Regarding the microstrip wirings according to Example 5 and Comparative Example 2, the transmission loss in a high frequency (frequency: 50 GHz) was measured using a vector network analyzer (manufactured by HP company). The characteristic impedance was set to 50 Ω. The transmission loss in Example 5 was decreased by 22% with respect to the transmission loss in Comparative Example 2.

Industrial Applicability

According to the present disclosure, there are provided a wiring board, which has excellent adhesiveness between an insulating layer and a metal wiring and a small transmission loss in a high frequency, and a method for manufacturing the same.

Reference Signs List

1: first insulating layer, 2: seed layer (metal layer), 3: wiring part (conductive part), 4: metal wiring, 5: second insulating layer, 10, 20: wiring board, 11, 16: insulating layer, 12, 17: seed layer, 13: ground layer, 15: conductor part, 18: signal layer, S: support substrate, Sa: conductive layer.

The invention claimed is:

1. A method for manufacturing a wiring board, the method comprising, in a following order:
   (a) a step of irradiating an insulating layer composed of a resin composition with active energy rays;
   (b) a step of adsorbing an electroless plating catalyst to the insulating layer; and
   (c) a step of forming a metal layer on a surface of the insulating layer by electroless plating, wherein
   in the step (a), a modified region having a thickness of 20 nm or more in a depth direction from the surface of the insulating layer and voids communicating from the surface of the insulating layer is formed by irradiation of the active energy rays.

2. The method for manufacturing a wiring board according to claim 1, wherein in the step (c), the metal layer is formed using an electroless copper plating solution.

3. The method for manufacturing a wiring board according to claim 1, wherein in the step (c), the metal layer is formed using an electroless copper-nickel-phosphorus plating solution.

4. The method for manufacturing a wiring board according to claim 1, wherein the active energy rays are ultraviolet rays having a wavelength of 254 nm or less.

5. The method for manufacturing a wiring board according to claim 1, wherein an arithmetic average roughness Ra of the surface of the insulating layer after the step (c) is 100 nm or less.

6. The method for manufacturing a wiring board according to claim 1, wherein a nickel content rate of the metal layer is 0.25 to 20% by mass.

7. A wiring board comprising:
   an insulating layer composed of a resin composition; and
   a metal wiring provided on a surface of the insulating layer, wherein
   the insulating layer has a modified region having a thickness of 20 nm or more in a depth direction from the surface, and
   copper contained in the metal wiring is dispersed in the modified region.

8. The wiring board according to claim 7, wherein a part of the metal wiring is formed by electroless plating, and
   an electroless plating catalyst is dispersed in the modified region.

9. The wiring board according to claim 7, wherein an average roughness Ra of the surface of the insulating layer is 100 nm or less.

10. The wiring board according to claim 7, wherein the resin composition is a cured product of a thermosetting resin composition.

11. The wiring board according to claim 7, wherein the resin composition is a cured product of a photosensitive resin composition.

12. The wiring board according to claim 7, further comprising a support substrate the insulating layer being formed on,
    wherein the support substrate is wafer-shaped and has a diameter of 200 mm, 300 mm or 450 mm.

13. The wiring board according to claim 7, further comprising a support substrate the insulating layer being formed on,
    wherein the support substrate is rectangular panel-shaped and has a side of 300 to 700 mm.

14. The wiring board according to claim 7, wherein the insulating layer has a thermal expansion coefficient of $80 \times 10^{-6}$ /K or less.

* * * * *